(12) United States Patent
Muralimanohar et al.

(10) Patent No.: US 9,003,247 B2
(45) Date of Patent: Apr. 7, 2015

(54) REMAPPING DATA WITH POINTER

(75) Inventors: Naveen Muralimanohar, Santa Clara, CA (US); Doe Hyun Yoon, Austin, TX (US); Jichuan Chang, Sunnyvale, CA (US); Parthasarathy Ranganathan, San Jose, CA (US); Norman Paul Jouppi, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 91 days.

(21) Appl. No.: 13/066,976

(22) Filed: Apr. 28, 2011

(65) Prior Publication Data

US 2012/0278651 A1 Nov. 1, 2012

(51) Int. Cl.
G11C 29/00 (2006.01)
G06F 11/20 (2006.01)

(52) U.S. Cl.
CPC ............... *G06F 11/20* (2013.01); *G11C 29/76* (2013.01)

(58) Field of Classification Search
USPC ........................................ 714/723
See application file for complete search history.

(56) References Cited

U.S. PATENT DOCUMENTS

| | | | | |
|---|---|---|---|---|
| 5,339,398 | A * | 8/1994 | Shah et al. ............... | 711/216 |
| 6,928,527 | B2 * | 8/2005 | Cohen et al. ............. | 711/156 |
| 7,509,526 | B2 * | 3/2009 | Hodder ..................... | 714/6.13 |
| 7,571,275 | B2 | 8/2009 | Nelson | |
| 7,661,043 | B2 * | 2/2010 | Sato ........................... | 714/723 |
| 7,681,089 | B2 * | 3/2010 | Ashmore .................. | 714/57 |
| 7,853,749 | B2 | 12/2010 | Kolokowsky | |
| 2005/0120266 | A1 * | 6/2005 | Cernea ...................... | 714/8 |
| 2009/0327580 | A1 | 12/2009 | Hamilton et al. | |
| 2010/0122015 | A1 * | 5/2010 | Fusella et al. ............ | 711/103 |
| 2010/0205363 | A1 | 8/2010 | Hwang et al. | |
| 2010/0229056 | A1 * | 9/2010 | Cleavelin et al. ........ | 714/718 |
| 2010/0332895 | A1 * | 12/2010 | Billing et al. ............. | 714/8 |
| 2011/0022931 | A1 | 1/2011 | Eleftheriou et al. | |
| 2011/0214008 | A1 * | 9/2011 | Tamura et al. ............ | 714/4.11 |
| 2011/0231627 | A1 * | 9/2011 | Egger et al. .............. | 711/170 |

OTHER PUBLICATIONS

Author: Doe Hyun Yoon, Naveen Muralimanohar, Jichuan Chang, Parthasarathy Ranganathan, Norman P. Jouppi, Mattan Erez; Title: FREE-p: Protecting Non-Volatile Memory against both Hard and Soft Errors; Publisher: IEEE, 978-1-4244-9435-4/11, Date 2011.*

* cited by examiner

*Primary Examiner* — April Y Blair
*Assistant Examiner* — Thien D Nguyen
(74) *Attorney, Agent, or Firm* — Hewlett-Packard Patent Department (57) ABSTRACT

Embodiments herein relate to a method for remapping data. In an embodiment, it is determined if a first memory block is faulty. A pointer is stored to the first memory block and a pointer flag of the first memory block is set when the first memory block is faulty. Data previously stored at the first memory block is written to a second memory block, where the pointer points to a location of the second memory block.

14 Claims, 7 Drawing Sheets

REMAPPING DATA WITH POINTER

BACKGROUND

Memory cells of a memory may become defective, for example, over time and/or by repeated use. As a result, data may be lost or incorrectly stored at the defective cells.

BRIEF DESCRIPTION OF THE DRAWINGS

The following detailed description references the drawings, wherein.

DETAILED DESCRIPTION

Specific details are given in the following description to provide a thorough understanding of embodiments. However, it will be understood by one of ordinary skill in the art that embodiments may be practiced without these specific details. For example, systems may be shown in block diagrams in order not to obscure embodiments in unnecessary detail. In other instances, well-known processes, structures and techniques may be shown without unnecessary detail in order to avoid obscuring embodiments.

Memory may suffer from data storage errors due to, for example, hard errors or soft errors. A hard error may refer to a hardware failure, such as a memory block failing to correctly store the data due to one or more defective memory cells of the memory block. Memory cells may become defective, for example, due to wear out, after a finite number of writes thereto. A soft error may refer to a non-hard failure, such as the data becoming corrupt due to resistance drift, spontaneous crystallization or write noise. To avoid or minimize such types of data loss or damage, techniques requiring relatively greater memory capacity, overhead, and/or customization of the memory, such as integration of error-tolerance logic into the memory, have been adopted.

However, these techniques may not accurately recognize soft errors in both the memory cells and/or peripheral circuitry, such as in the wires and packaging, of the memory. As a result, these techniques may increase the manufacturing costs or overhead of the memory while still failing to detect all non-memory cell soft errors.

Embodiments provide a method and/or device for protecting against data storage errors, including both hard and soft errors, without requiring significantly greater memory capacity, overhead or customization of the memory. For example, embodiments may only remap a faulty memory block included in a memory page, with the remapping functionality implemented in a controller, and not the memory. Thus, the memory may not have to be customized. In an embodiment, a pointer may be stored at the faulty memory block itself and point to a location of the remapped data. Thus, embodiments may provide relatively low cost and/or non-customized memory that protects against both hard and soft errors.

Figure 1:
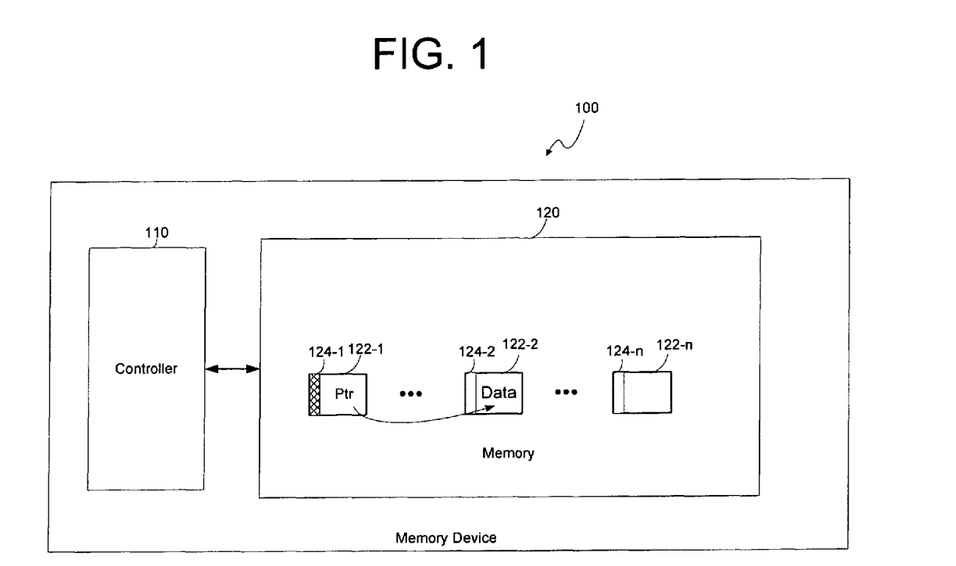
FIG. 1 is a block diagram of an example memory system.

FIG. 1 is a block diagram of an example memory system 100. In the embodiment of FIG. 1, the memory system 100 includes a controller 110 and a memory 120. The controller 110 may include control logic and/or other hardware devices suitable for access and execution of instructions and data stored in a machine-readable storage medium (not shown). The machine-readable storage medium may be any electronic, magnetic, optical, or other physical storage device. The controller 110 is to read data and/or addresses from the memory 120 and to write data and/or addresses to the memory 120.

The controller 110 may communicate with a device (not shown), to receive or transmit information, such as an address or data. For example, the controller 110 may communicate with a microprocessor or an operating system (OS) (not shown) stored at the device. The device may be any type of hardware and/or firmware component integrated with or separate the controller 110. Further, the controller 110 may include one or more interfaces (not shown) to communicate with the memory 120 and/or device. The controller 110 will be explained in greater detail with respect to FIG. 2.

The memory 120 may be a volatile and/or non-volatile memory. Examples of the memory may include various types of Random Access Memory (RAM), such as Phase Change RAM (PCRAM), Non-Volatile RAM (NVRAM), Dynamic RAM (DRAM), Static RAM (SRAM) and the like.

In FIG. 1, the memory 120 includes a plurality of memory blocks 122-1 to 122-n, where n is an integer number. Each of the memory blocks 122-1 to 122-n have a plurality of cells (not shown). Each of the plurality of cells may store one or more bits of data. For example, multi-level cells (MLC) may store multiple bits of data. Each of the plurality of memory blocks 122-1 to 122-n includes a pointer flag 124-1 to 124-n to indicate whether data or a pointer is stored at a corresponding one of the plurality of memory blocks 122-1 to 122-n. The memory block 122 may refer to any one of the plurality of memory blocks 122-1 to 122-n and the pointer flag 124 may refer to any one of the pointer flags 124-1 to 124-n corresponding to the memory block 122.

The pointer flag 124 may be stored at a single bit of each of the memory blocks 122-1 to 122-n. Alternatively, the pointer flag 124 may also be stored separately from the memory 120, such as at another memory or computer readable medium accessible by the controller 110. The memory blocks 122-1 to 122-n may, for example each be 64 bytes (B) in size. However, embodiments of the memory blocks 122-1 to 122-n may include various different block sizes.

A first pointer flag 124-1 of a first memory block 122-1 is set by the controller 110 when a pointer is stored at the first memory block 122-1, as shown by the cross-hatched pattern for the first pointer flag 124-1 in FIG. 1. Otherwise, as shown by an empty space for a second pointer flag 124-2 of a second memory block 122-2, the second pointer flag 124-2 is reset when data is stored at the second memory block 122-2. Any operations and/or functionality described for the first and second memory blocks first memory block 122-1 and 122-2 may apply to any of the plurality of memory blocks 122-1 to 122-n.

The memory 120 shows data remapped from a first memory block 122-1 to a second memory block 122-2. A pointer pointing to the second memory block 122-2 is stored at the first memory block 122-1 and data previously stored at the first memory block 122-1 is stored at the second memory block 122-2.

The controller 110 is to store a pointer at the first memory block 122-1 when the first memory block 122-1 is faulty. The first memory block 122-1 may be faulty when a number of bit errors for the data stored therein equals or exceeds an error threshold, where the error threshold relates to a number of bit errors at which the data cannot be sufficiently and/or timely corrected by the controller 110.

For example, a portion of each of memory blocks 122-1 to 122-n may be allocated for error checking and correcting (ECC) information, such as, approximately 8 B for a 64 B memory block. The controller 110 may store ECC code, such as BCH code, at the machine-readable storage medium, which may executable by the processor and/or control logic of the controller 110 to detect and/or correct data errors. The data and ECC information for a corresponding memory block 124 may be then used by the controller 110 to detect a number of bit errors for the data of the corresponding memory block 122. If the number of bit errors is less than the error threshold, the controller 110 may still be able to correctly read the data based on the ECC information and one or more procedures implemented by the ECC code. Therefore, in this case, the bit errors may be tolerated. Otherwise, if the number of bit errors is greater than or equal to the error threshold, the controller 110 determines the corresponding memory block 124 to be faulty and the data of the memory block 122 is remapped to another location. A method for determining whether the memory block 122 is faulty is explained in greater detail with respect to FIG. 5

As all of the memory cells of the first memory block 122-1 will not generally be defective, the controller 110 may store the pointer at the non-defective memory cells of the first memory block 122-1. Moreover, as the pointer may require relatively few bits of storage compared to a bit capacity of the first memory block 122-1, the controller 110 may store multiple copies of the pointer and/or error codes, such as modular redundancy, at the first memory block 122-1 to guard against errors. The pointer may point to a remapped location of the data, such as the second memory block 122-2 in FIG. 1, where the second memory block 122-2 may store the data with a number of bit errors less than the error threshold. An operation of the memory 120 will be described in further detail with respect to FIGS. 3A-6.

Figure 2:
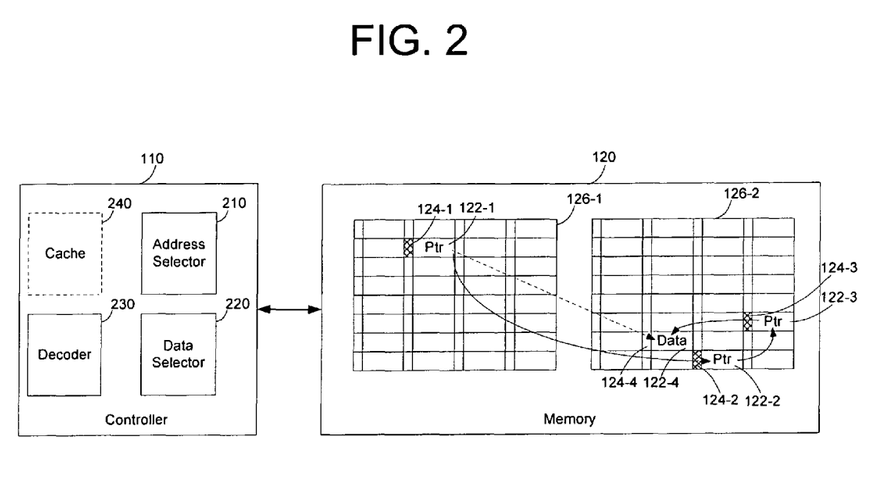
FIG. 2 is a more detailed block diagram of the memory system of FIG. 1.

FIG. 2 is a more detailed block diagram of the memory system 100 of FIG. 1. As shown in FIG. 2, the controller 110 may include at least an address selector 210, a data selector 220 and a decoder 230. The controller 110 may also optionally include a cache 240. For the sake of clarity, other components of the controller 110 are not shown. For example, the controller 110 may also include one or more of the following unshown components: buffers, error correction/detection logic, ECC encoding logic, control logic for scheduling requests to memory devices, receiving data from memory devices, and forwarding the received data or other control signals to the other parts of a memory hierarchy such as caches, etc.

The address selector 210 is to transmit an address to the memory 120 to select one of the plurality of memory blocks 122-1 to 122-n, where the address relates to a location of the selected memory block 122. The data selector 220 is to transmit and receive information to and from the selected memory block 122, where the information may include data or a pointer. The address and data selectors 210, 220 may include, for example, multiplexors (not shown) and queues (not shown). The multiplexor of the address selector 210 may select between a write request queue and a read request queue. The write request quest may include addresses of the memory blocks 122 to which information is to be written and the read request queue may include addresses of the memory blocks 122 to which information is to be read.

The multiplexor of the data selector 210 may select between a write information queue and a read information queue. The write information queue may include information to be written to the memory block 122 selected by the address selector 210 and the read information queue may include information to be read from the memory block 122 selected by the address selector 210.

The decoder 230 is to decode an address pointed to by a pointer. For example, the information read from one of the memory blocks 122-1 to 122-n by the data selector 2220 may be a pointer. Therefore, the decoder 230 may decode and forward the address pointed to by the pointer to the address selector 210. The address selector 210 may subsequently, in conjunction with the data selector 220, read from or write to the address pointed to by the pointer.

As shown in FIG. 2, the memory blocks 122 may be grouped into a plurality of pages. While only a first page 126-1 and a second page 126-2 are shown in FIG. 2, embodiments may include more than two pages. Further, a pointer of the memory block 122 may point to another pointer. In FIG. 2, the first memory block 122-1 is shown include a pointer that points to the second memory block 122-2 including a pointer pointing to a third memory block 122-3. Subsequently, the third memory block 122-3 points to a fourth memory block 122-4 storing the data. Thus, in this case, the controller 110 may have to perform four read accesses to the different memory blocks 122-1 to 122-4 and decode three pointers before accessing the data.

These operations may add additional latency for reading the data and load on the controller 110. Hence, where the data is remapped more than once, the controller 110 may optionally update the pointer of an initially accessed memory block 122 to point to a last accessed memory block 122. For example, the pointer of the first memory block 122-1 may be updated and/or replaced to point to the fourth memory block 122-4, as shown by the dotted arrow line in FIG. 2. An operation of the controller 110 with respect to storing and/or updating pointers will be explained in greater detail with respect to FIGS. 4A and 4B.

The controller 110 may optionally include the cache 240. In one embodiment, the cache may simply store the pointers read from any of the memory blocks 122-1 to 122-n in order to avoid re-fetching them on a hit for the corresponding memory block 122. For example, the cache 240 may be a 1024-set 4-way set-associative cache. In another embodiment, the cache 240 may use a hashing index, as described in greater detail with respect to FIG. 3.

Figure 3:
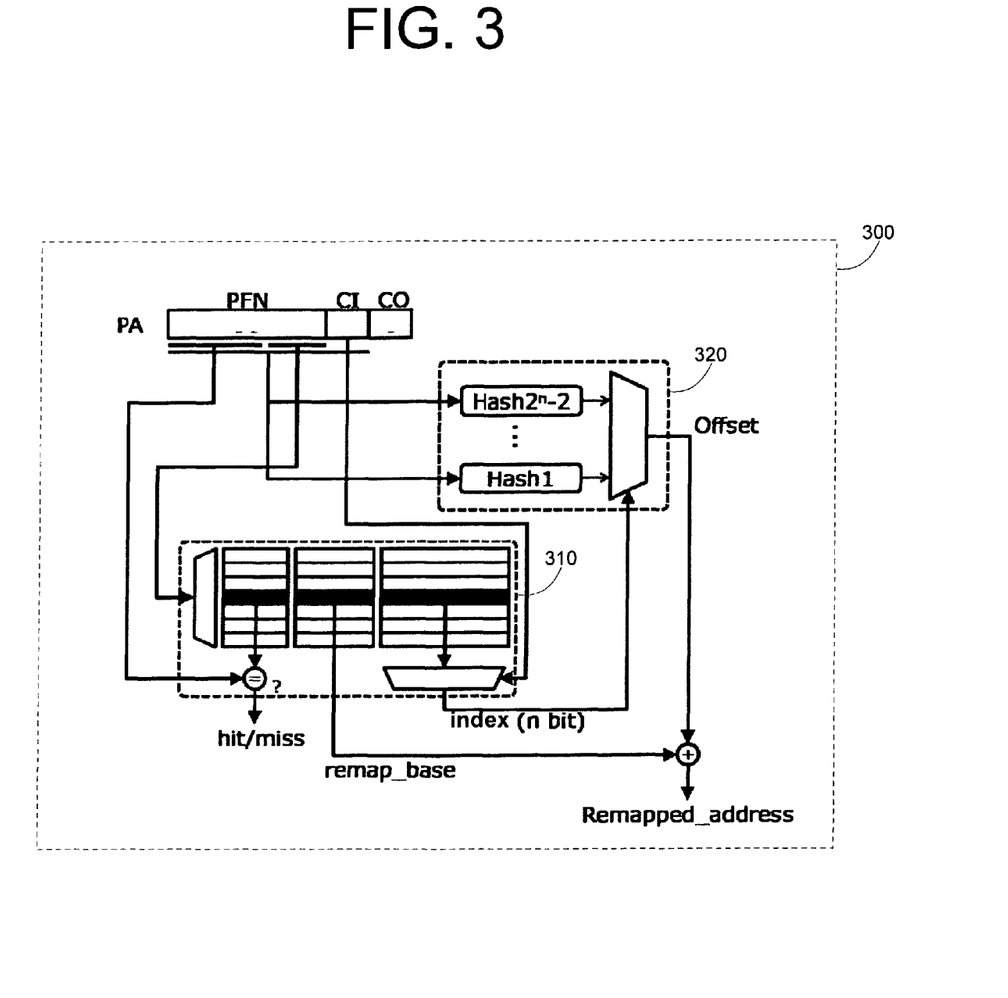
FIG. 3 is a block diagram of an example cache of the controller of FIG. 2.

FIG. 3 is a block diagram of an example cache 300 of the controller of FIG. 2. In this embodiment, the cache 300 may include a more efficient index with hash based remapping. The address of the pointer (PA) may be split into a physical frame number (PFN), a cache line index (CI), and a cache line offset (CO). A table 310 included in the cache 300 may be addressed by the PFN. While the table 310 is shown as a direct mapped cache, embodiments may also include fully or set associative caches. Each entry in the table 310 may include a tag (for the PEN), a remap_base address and an n bit hash index.

As shown in FIG. 3, instead of maintaining a remap table storing an entire address of a remapped location, the table 310, may associate each page of the memory blocks with the remap_base and the hash index vector. The remap_base identifies a page that is being used to store remapped memory blocks 122, while the hash index is used to find a memory block within that page. The hash index may be used to select one of a set of hash functions from a hash selector 320.

As shown in FIG. 3, the hash selector 320 may include a multiplexor to select from a plurality of hash functions Hash1 to Hash$2^n$-2. The hash functions Hash1 to Hash$2^n$-2 are applied to the memory block's 122 original address (PFN and CI), with the result of the selected hash function being used as an offset from the page's remap_base as the final remapped address. Thus, embodiments may compute a remapped location without accessing the stored pointer at memory block 122. Additionally, all the remapped locations associated with an entire page may be stored more efficiently.

However, if two memory blocks 122 are remapped to a single location, a hash collision may occur. In such a case, the OS may communicate with the controller 110 to check for collisions at the time that the memory block 122 is remapped, which is generally rare. When a collision is detected, the OS may remap the block to a different location. Most of the memory blocks 124 will not generally be faulty and therefore not require remapping. The OS may communicate with memory system 100 to select the remap_base address for a page and to allocate regions for remapping to optimize or improve a total memory capacity used for the remapped locations and to minimize or reduce the likelihood of a hash collision.

Figure 4A:
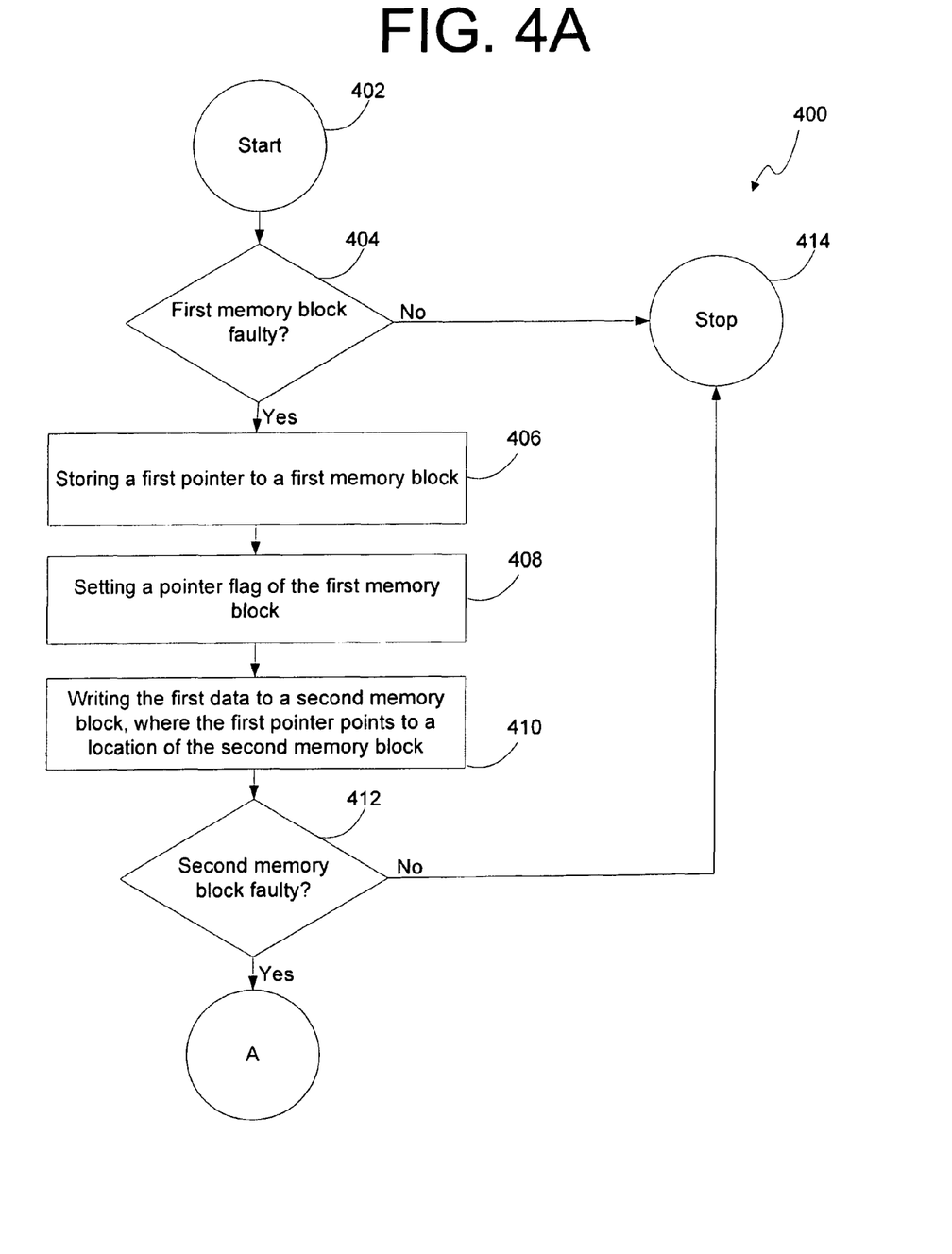
FIGS. 4A and 4B are a flowchart of an example method for remapping.
Figure 4B:
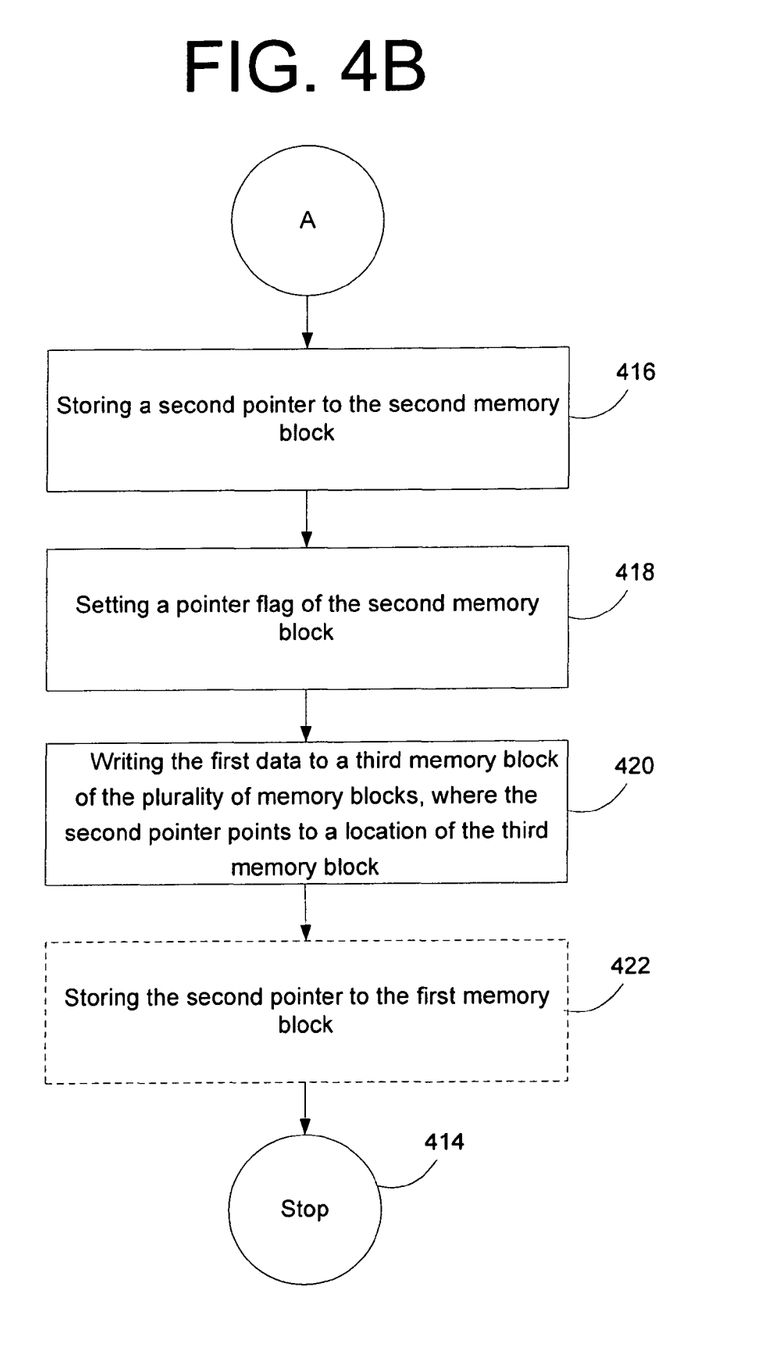

FIGS. 4A and 4B are a flowchart of an example method 400 for remapping. Although execution of the method 400 is described below with reference to the memory system 100 of FIGS. 1 and 2, other suitable components for execution of the method 400 will be apparent to those of skill in the art. Further, while the method 400 refers to the first and second memory blocks 122-1 and 122-2, the method 400 may be applied to any of the memory blocks 122-1 to 122-$n$ of the memory system 100. Further, the first and second memory blocks 122-1 and 122-2 may refer to any of the any of the memory blocks 122-1 to 122-$n$.

In the embodiment of FIGS. 4A and 4B, the method 400 starts at block 402 and proceeds to block 404, where the memory controller 110 determines if the first memory block 122-1 of the memory 120 is faulty. The first memory block 122-1 is faulty when a number of bit errors for a first data stored at the first memory block 122-1 is greater than or equal to the error threshold. An example technique for determining if a memory block 122 is faulty is explained above with respect to FIG. 2 and below with respect to FIG. 5. If the first memory block 122-1 is not faulty, the controller 110 proceeds to block 414 and stops the remapping process. Instead, the controller 110 may perform an operation on the first memory block 122-1, such as reading from or writing to the first memory block 122-1, as explained in greater detail with respect to FIG. 6.

If the first memory block 122-1 is faulty, the controller 110 stores a first pointer to at least one of the plurality of cells of the first memory block 122-1 at block 406. As noted above with respect to FIG. 1, multiple copies of the pointer and/or error codes may be stored at the first memory block 122-1. The first pointer points to a location of the second memory block 122-2. The controller 110 is to communicate with the OS when a faulty memory block 122 is found and the OS is to identify a location to remap the data of a faulty memory block 122. In this case, the OS may identify the second memory block 122-1 as a location to remap the first data of the faulty first memory block 122-1. The OS may generally attempt to remap to a location having a same page as the faulty memory block 122-1. In the absence of an available location on the same page, the OS may allocate a new page.

Next, at block 408, the controller 110 sets the pointer flag of the first memory block 122-1 to indicate that a pointer, and not data, is stored at the first memory block 122-1. As noted above, each of the plurality of memory blocks 122-1 to 122-$n$ includes a pointer flag. Then, the controller 110 writes the first data to the second memory block 122-2 at block 410. An order of the blocks 406, 408 and 410 may be interchangeable in embodiments.

However, the second memory block 122-2 may also be faulty or become faulty at a later time. Though the OS may generally select a remapped location, such as the second memory location 122-2, that is initially non-faulty. Thus, the controller 110 may subsequently check if the remapped location is faulty. In FIG. 4A, the controller 110 determines if the second memory block 122-2 is faulty at block 412 in a manner similar to the first memory block 122-1.

If the second memory block 122-2 is not faulty, the controller 110 proceeds to block 414 and stops the remapping process. If the second memory block 122-2 is faulty, the controller 110 proceeds to block 416.

The controller 110 stores a second pointer to at least one of the plurality of cells of the second memory block 122-2 at block 416. The second pointer points to a location of the third memory block 122-3. The third memory block 122-3 may be selected by the OS as described above with respect to the second memory block 122-2.

Next, at block 418, the controller 110 sets the pointer flag of the second memory block 122-2 to indicate that a pointer, instead of data, is now being stored at the second memory block 122-2. Then, the controller 110 writes the first data to the third memory block 122-3 at block 420.

Optionally, the controller 110 may store the second pointer to the first memory block 122-1 at block 422, to reduce a number of total accesses required to read the first data, as explained above with respect to FIG. 2. Further, the controller 110 may skip the operation of storing the second pointer to the second memory block 122-2 at block 416 if the controller 110 is to already store the second pointer to the first memory block 122-1 at block 422. An order of the blocks 416, 418 and 420 and 422 may be interchangeable in embodiments. The controller 110 may then proceed to block 414 and stop the remapping process.

While the remapping method 400 above is shown with respect to one or two remapping operations, the remapping method 400 may be scaled and/or repeated to apply to a chain of more than two remapping operations. For example, as shown in FIG. 2, should the third memory block 122-3 become faulty, the first data may be mapped to the fourth memory block 122-4 by following operations similar to that of blocks 416, 418 and 420. Further, a pointer of the initial memory block that stored the first data, such as first memory block 122-1 may be continuously or periodically updated to point to a final destination of the first data, such as the fourth memory block 122-4, by following operations similar to that of block 422.

Figure 5:
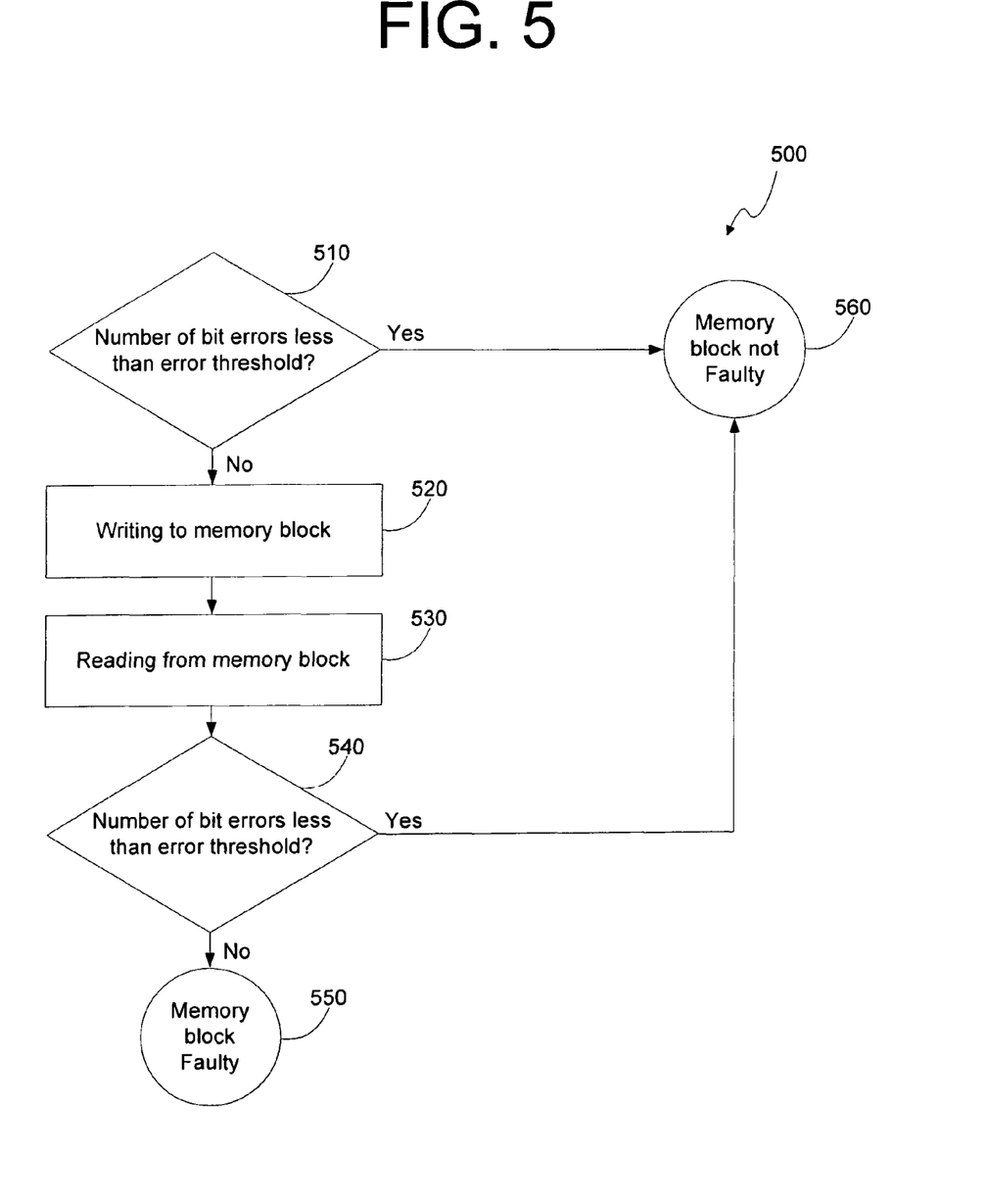
FIG. 5 is a flowchart of an example method for determining if a memory block is faulty.

FIG. 5 is a flowchart of an example method 500 for determining if a memory block 122 is faulty. Further, the method 500 is also an example for implementing an operation of the blocks 404 and 412 of FIG. 4A. Although execution of the method 500 is described below with reference to the memory system 100 of FIGS. 1 and 2, other suitable components for execution of the method 500 will be apparent to those of skill in the art.

In the embodiment of FIG. 5, the controller 110 reads the data and the ECC information of the memory block 122 being accessed to determine if the number of bit errors of the data of the memory block 122 is less than the error threshold at block 510. The executed ECC code stored at the controller 110 detects a number of bit errors in the data based on analysis of the ECC information and/or data. Based on a type of correction scheme implemented by the ECC code, the controller 110 may be able to tolerate the bit errors of the data, if the number of bit errors is less than the error threshold, as described above with respect to FIG. 1.

Further, the ECC code may include a plurality of correction schemes, where a different one of the correction schemes may be used based on a number of the bit errors. The different schemes may be able to identify and/or correct a different number of the bit errors as well as have different latencies. In an embodiment, the error threshold may refer to a greatest number of bits that may be corrected by any one of the correction schemes. However, the error threshold may be defined according to various other ways in embodiments, such as according to a user's or manufacturer's preference.

If the number of bit errors of the data is less than the error threshold, the controller 110 may be able to use the ECC information to overcome and/or correct the errors of the data. As such, the data may not need to be remapped and the controller 110 may proceed to block 560 and determine the memory block 122 to be not faulty. Otherwise, the controller 110 may rewrite the data to the memory block 122 at block 520 and then re-read the data at block 530. Then, the controller 110 again determines if the number of bit errors of the data of the memory block 122 is less than the error threshold at block 540.

As any bit errors in the data caused by soft errors may have been corrected by rewriting the data, a total number of the bit errors of the data may have been reduced. However, any bit errors in the data caused by hard errors, such as defective memory cells of the memory 122, will not be corrected by rewriting the data. If the number bit errors of the data is now less than the error threshold, the controller 110 proceeds to block 560 and determines the memory block 122 to be not faulty. However, if the number of bit errors of the data remains greater than or equal to the error threshold, then the controller 110 will proceed to block 550 and determine the memory block to be faulty, thus requiring remapping of the data.

Figure 6:
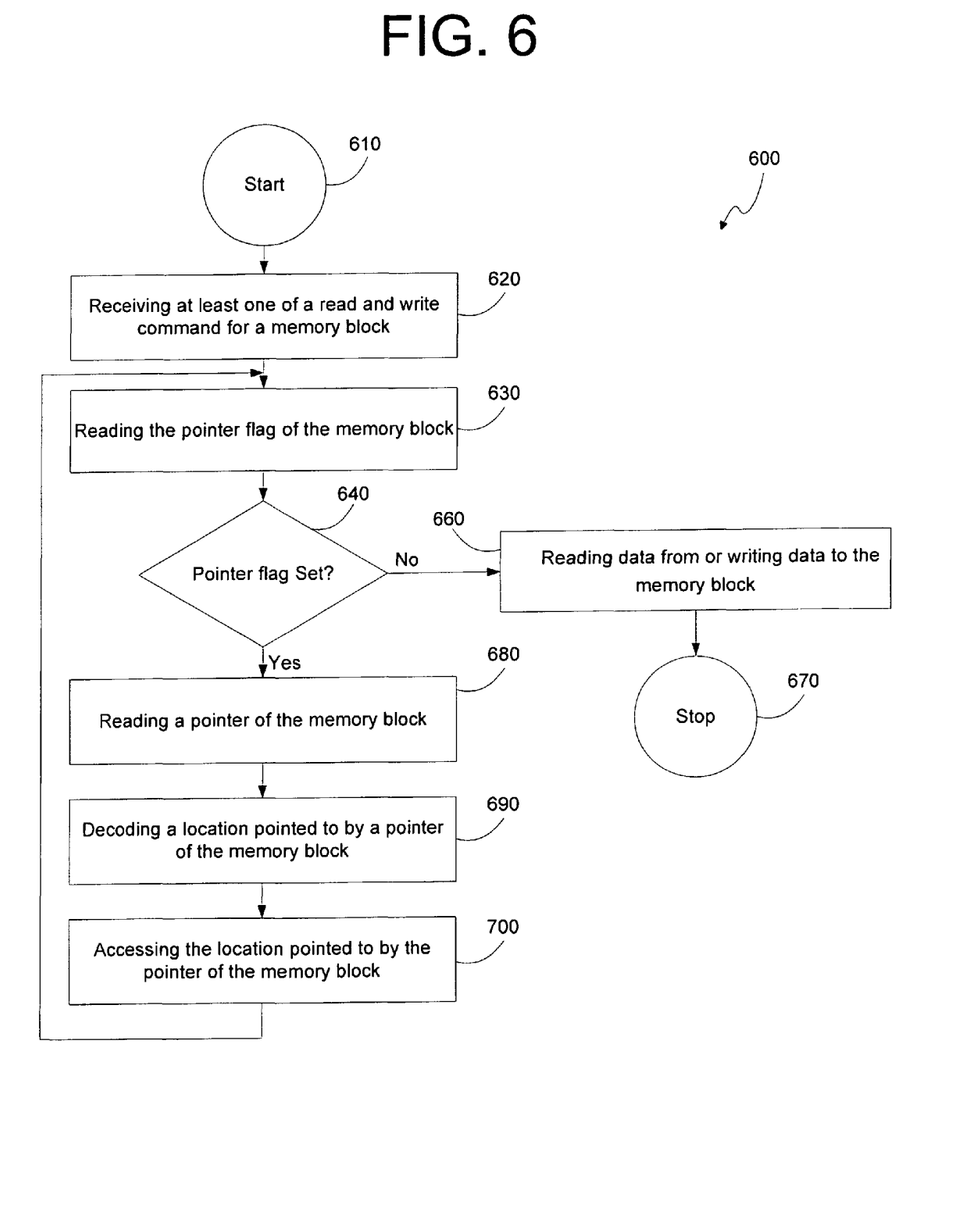
FIG. 6 is a flowchart of an example method for reading from or writing to a memory.

FIG. 6 is a flowchart of an example method 600 for reading from or writing to the memory 120. Although execution of the method 600 is described below with reference to the memory system 100 of FIGS. 1 and 2, other suitable components for execution of the method 400 will be apparent to those of skill in the art.

In the embodiment of FIG. 6, the method 600 starts at block 610 and proceeds to block 620, where the controller 110 receives at least one of a read and write command for the memory block 122. The read or write command may be received, for example, from the software running on a microprocessor or a peripheral device.

Next, at block 630, the controller 110 reads the pointer flag 124 of the memory block 122 and proceeds to block 640. If the pointer flag 124 is not set, the controller 110 determines that data is stored at the memory block 122 and proceeds to block 660. At block 660, the controller 110 carries out the command and at least one of reads data from and writes data to the memory block 122. The controller then completes the method 600 and stops at block 670.

If the pointer flag 124 is set, the controller 110 determine that a pointer is stored at the memory block 122 and proceeds to block 680. At block 680, the controller 110 reads the pointer of the memory block 122. Then, the decoder 230 of the controller 110 decodes a location or address pointed to by the pointer of the memory block 122 at block 690. Next, the controller 110 accesses the decoded location, such as another of the memory blocks 122, and then flows back to block 630 to read the pointer flag at the decoded location. Thus, reading remapped data requires no interaction with an external processor.

According to the foregoing, embodiments provide a method and/or device for protecting against data storage errors, including both hard and soft errors, without requiring significantly greater memory capacity, overhead or customization of the memory. For example, embodiments include implementing remapping functionality at the controller and not the memory, in order to avoid customization of the memory. In addition, faulty memory blocks may be independently remapped to non-faulty memory blocks with pointers to the non-faulty memory blocks being stored at faulty memory block, to reduce overhead and memory requirements.

We claim:

1. A method for remapping data, comprising:
   determining if a first memory block of a plurality of memory blocks of a memory is faulty such that the first memory block includes a plurality of defective memory cells and a plurality of non-defective memory cells, where each of the plurality of memory blocks includes a pointer flag to indicate whether data or a pointer is stored in each of the plurality of memory blocks;
   in response to determining that the first memory block is faulty, storing within the non-defective memory cells of the first memory block and not within the defective memory cells of the first memory block a first pointer and at least one copy of the first pointer, the first memory block having sufficient non-defective memory cells to store the first pointer and the at least one copy of the first pointer;
   setting the pointer flag of the first memory block when the first memory block is faulty, the set pointer flag of the first memory block to indicate that the first memory block stores information related to a pointer and not to data;
   writing first data to a random second memory block of the plurality of memory blocks when the first memory block is faulty, the first data previously stored at the first memory block, wherein the first pointer points to a location of the second memory block; and
   continuously updating the first pointer of the first memory block to point to a most current location where the first data is last stored, when the first data is stored at a random location other than second memory block after a repeated remapping.

2. The method of claim 1, further comprising:
   determining if the second memory block is faulty;
   storing a second pointer to at least one of the plurality of cells of the second memory block when the second memory block is faulty;
   setting the pointer flag of the second memory block when the second memory block is faulty; and
   writing the first data to a random third memory block of the plurality of memory blocks when the second memory block is faulty, wherein
   the second pointer points to a location of the third memory block.

3. The method of claim 2, further comprising:
   storing the second pointer to at least one of the plurality of cells of the first memory block when the second memory block is faulty.

4. The method of claim 3, further comprising:
   receiving a request to access the first data;
   accessing the first memory block; and accessing the third memory block to read the first data based on the accessed first memory block, wherein the accessing does not access at least one of the first and second memory blocks before accessing the third memory block.

5. The method of claim 2, further comprising:

storing at least one of the first and second pointers in a cache; and reading the at least one of the first and second cached pointers when accessing the first data, wherein the first and second memory blocks are not accessed to read the first data.

6. The method of claim 5, further comprising:

hashing address locations of at least one of the second and third memory blocks to calculate the at least one of the first and second stored pointers based on a location of at least one of the first and second memory blocks within at least one page of a plurality of pages, each of the plurality of memory blocks being grouped into one of the plurality of pages.

7. The method of claim 1, wherein the determining if the first memory block is faulty includes, first detecting a number of bit errors of the first data stored at the first memory block, wherein the first memory block is not faulty if the number of bit errors is less than an error threshold.

8. The method of claim 7, wherein the determining if the first memory block is faulty further includes, writing the first data to the first memory block if the number of bit errors is greater than or equal to the error threshold;

reading the written first data from the first memory block; and second detecting a number of bit errors of the first data stored at the first memory block, wherein the first memory block is faulty if the number of bit errors is greater than equal to the error threshold.

9. The method of claim 1, wherein the storing stores at least one of duplicates of the first pointer and error checking and correcting (ECC) information to the first memory block.

10. The method of claim 1, further comprising:

receiving at least one of a read and write command for one of the plurality of memory blocks;

reading the pointer flag of the one of the plurality of memory blocks; and at least one of reading data from and writing data to the one of the plurality of memory blocks when the pointer flag of another of the plurality of memory blocks is not set.

11. The method of claim 1, further comprising:

reading a pointer of the one of the plurality of memory blocks when the pointer flag is set;

decoding a location pointed to by the pointer of the one of the plurality of memory blocks when the pointer flag is set; and accessing the location pointed to by the pointer of the one of the plurality of memory blocks when the pointer flag is set.

12. A memory system, comprising:

a memory including a plurality of memory blocks having a plurality of cells, each of the plurality of memory blocks includes a pointer flag to indicate whether data or a pointer is stored in each of the plurality of memory blocks; and a controller to, determine if a first memory block of the plurality of memory blocks is faulty such that the first memory block includes a plurality of defective memory cells and a plurality of non-defective memory cells, in response to determining that the first memory block is faulty, store within the non-defective memory cells of the first memory block and not within the defective memory cells of the first memory block a first pointer and at least one copy of the first pointer, the first memory block having sufficient non-defective memory cells to store the first pointer and the at least one copy of the first pointer, set the pointer flag of the first memory block when the first memory block is faulty, the set pointer flag of the first memory block to indicate that the first memory block stores information related to a pointer and not to data, write first data to a random second memory block of the plurality of memory blocks when the first memory block is faulty, the first data previously stored at the first memory block, wherein the first pointer points to the second memory block, and continuously update the first pointer of the first memory block to point to a most current location where the first data is last stored when the first data is stored at a random location other than second memory block after a repeated remapping.

13. The memory system of claim 12, wherein, the controller is to read the pointer flag of a third memory block of the plurality of memory blocks before at least one of writing data to and reading data from the third memory block, and the memory controller includes, a decoder to decode a location pointed to by the first pointer, and a cache to at least one of store the location pointed to by the first pointer for the first data and to calculate a location pointed to by the first pointer for the first data.

14. The memory system of claim 12, wherein the controller is to store at least one of duplicates of the first pointer and error checking and correcting (ECC) information to the first memory block.

\* \* \* \* \*